(12) United States Patent
Okouchi

(10) Patent No.: US 8,853,561 B2
(45) Date of Patent: Oct. 7, 2014

(54) PRINTED WIRING BOARD WITH IMPROVED CORROSION RESISTANCE AND YIELD

(75) Inventor: Yuichi Okouchi, Yamanashi (JP)

(73) Assignee: FANUC Corporation, Yamanashi (JP)

( * ) Notice: Subject to any disclaimer, the term of this patent is extended or adjusted under 35 U.S.C. 154(b) by 0 days.

(21) Appl. No.: 13/477,151

(22) Filed: May 22, 2012

(65) Prior Publication Data

US 2012/0325531 A1 Dec. 27, 2012

(30) Foreign Application Priority Data

Jun. 27, 2011 (JP) ................................. 2011-142338

(51) Int. Cl.
*H05K 1/09* (2006.01)
*H05K 3/46* (2006.01)
*H05K 3/42* (2006.01)
*H05K 3/00* (2006.01)

(52) U.S. Cl.
CPC .............. *H05K 3/4602* (2013.01); *H05K 3/427* (2013.01); *H05K 3/0035* (2013.01); *H05K 2203/061* (2013.01)
USPC ............................ 174/262; 174/260; 174/257

(58) Field of Classification Search
CPC .............. H05K 3/4602; H05K 3/0035; H05K 2203/061; H05K 3/427
USPC .......................................... 174/262, 257, 260
See application file for complete search history.

(56) References Cited

U.S. PATENT DOCUMENTS

| | | | |
|---|---|---|---|
| 6,376,049 B1 | 4/2002 | Asai et al. | |
| 6,376,052 B1 | 4/2002 | Asai et al. | |
| RE40,947 E * | 10/2009 | Asai et al. | ..................... 428/209 |
| 8,188,380 B2 * | 5/2012 | Kawai et al. | .................. 174/262 |
| 2004/0078964 A1 | 4/2004 | Itou et al. | |
| 2009/0316375 A1 * | 12/2009 | Ueda | ............................. 361/768 |

FOREIGN PATENT DOCUMENTS

| | | |
|---|---|---|
| CN | 1474642 A | 2/2004 |
| CN | 1493177 A | 4/2004 |
| JP | 10321115 A | 12/1998 |
| JP | 2000-174410 A | 6/2000 |
| JP | 2001-291936 A | 10/2001 |
| JP | 2001332851 A | 11/2001 |
| JP | 2001358445 A | 12/2001 |
| JP | 201045324 A | 2/2010 |

OTHER PUBLICATIONS

A JP Office Action, dated Jul. 10, 2012, issued in JP Application No. 2011-142338.
Office Action dated Oct. 31, 2013, corresponds to Chinese patent application No. 201210206146.2.
Office Action issued May 12, 2014, corresponds to Chinese patent application No. 201210206146.2.

* cited by examiner

*Primary Examiner* — Hoa C Nguyen
*Assistant Examiner* — Amol Patel
(74) *Attorney, Agent, or Firm* — Lowe Hauptman & Ham, LLP

(57) ABSTRACT

A printed wiring board is configured such that copper-laminated plates and prepregs are alternately laminated and surface conductive layers are arranged on the outermost positions outside the prepregs, wherein all leading wires from pads for surface-mount parts to be mounted on the surface of the printed wiring board are connected to inner conductive layers of the copper laminated plates through blind via holes connecting the surface conductive layer and the copper-laminated plate therebelow, and inner via holes connecting conductive layers on the top and rear surfaces of at least one of the copper-laminated plates that is nearest to the surface conductive layer are provided and a conductive film is formed in the inner via holes.

3 Claims, 6 Drawing Sheets

(a)

(b)
LAMINATE AND PRESS

BOARD
SURFACE VIEW

BOARD
CROSS-SECTIONAL
VIEW

BOARD
SURFACE VIEW

BOARD
CROSS-SECTIONAL
VIEW

PRINTED WIRING BOARD WITH IMPROVED CORROSION RESISTANCE AND YIELD

RELATED APPLICATIONS

The present application is based on, and claims priority from, Japanese Application Number 2011-142338, filed Jun. 27, 2011, the disclosure of which is hereby incorporated by reference herein in its entirety.

BACKGROUND OF THE INVENTION

1. Field of the Invention

The present invention relates to a printed wiring board with improved corrosion resistance and yield.

2. Description of the Related Art

A width of a wiring pattern on a printed wiring board is made finer along with downsizing of electronic parts, and thus there is a problem in that the pattern is more difficult to form and a yield lowers during manufacture of the printed wiring board and a problem that disconnection easily occurs due to corrosion or electric corrosion in a field use environment. Particularly, there is a problem that a cutting fluid is misted in a factory where machines are used, the mist sticks to the printed circuit board surface, and thus wiring patterns leading from the parts' terminals disconnect due to corrosion or electric corrosion.

Japanese Patent Application Laid-Open No. 10-321115 discloses a technique for applying insulation coating which is excellent in corrosion resistance or moisture-proof property such as polyurethane resin on a printed circuit board. With this technique, in order to electrically connect the printed wiring board with electronic parts such as connector, the insulation coating needs to be applied after the parts are mounted. Thus, there is a problem that a coating material sticks to the electronic parts such as connector, which causes a contact failure.

Japanese Patent Application Laid-Open No. 2001-358445 discloses a technique for arranging blind via holes (BVH) in pads for surface-mount parts and forming leading wires (lines) in inner conductive layers. With this technique, when the blind via holes (BVH) are added to all the pads for mounting electronic parts, the wirings patterns concentrate on the inner conductive layers to which the blind via holes (BVH) are connected, and all the wires are difficult to connect.

Japanese Patent Application Laid-Open No. 2001-332851 discloses a technique for covering the outer peripheries of the pads with solder resist and eliminating exposure of wires leading from the pads. With this technique, the pad sides are not soldered, and thus there is a problem that a strength of soldering lowers.

SUMMARY OF THE INVENTION

FIG. 8A (surface view) and FIG. 8B (cross-sectional view) are views for explaining a pad (normal pad) for surface-mount parts in a structure in which an end 53 of a pad 50 is separated from an opening end 52 of solder resist 51 (see a portion denoted by reference numeral 55).

Since the pad 50 and a solder ball terminal 31 are soldered each other at the upper surface and the side and thus a strength of soldering is high but a leading wire 54 is not covered with the solder resist 51, disconnection is highly likely to occur due to corrosion or electric corrosion. Reference numeral 56 denotes an insulation resin layer.

FIG. 9A (surface view) and FIG. 9B (cross-sectional view) are views for explaining a pad for surface-mount parts (over-resist pad) in a structure in which an opening end 62 of solder resist 61 extends from an end of a pad 60 toward the center of the pad and the solder resist 61 covers the periphery of the pad 60.

A leading wire 63 is covered with the solder resist 61. The structure of the over-resist pad 60 is such that disconnection due to corrosion or electric corrosion is less likely to occur as compared with the normal pad in FIGS. 8A and 8B but the strength of soldering is low as compared with the normal pad of FIGS. 8A and 8B since the solder ball terminal 31 is soldered to only the upper surface of the over-resist pad 60. Reference numeral 64 denotes an insulation resin layer. Reference numeral 65 denotes a portion where the solder resist 61 covers the periphery of the pad 60.

In terms of the above problems of the conventional techniques, it is an object of the present invention to enhance a corrosion resistance of a printed wiring board without applying coating after mounting of parts, and to boost a yield at the same time.

A printed wiring board according to a first aspect of the present invention is such that copper-laminated plates and prepregs are alternately laminated and surface conductive layers are arranged on the outermost positions outside the prepregs, wherein all leading wires from pads for surface-mount parts are connected to inner conductive layers of the copper-laminated plates through blind via holes connecting the surface conductive layer and the copper-laminated plate therebelow, and inner via holes connecting conductive layers on the top and rear surfaces of at least one of the copper-laminated plates that is nearest to the surface conductive layer are provided, and a conductive film is formed in the inner via holes.

A printed wiring board according to a second aspect of the present invention is such that copper-laminated plates and prepregs are alternately laminated and surface conductive layers are arranged at the outermost positions outside the prepregs, and the printed wiring board includes pads for surface-mount parts to be mounted on the surface of the printed wiring board, and at least one solid pattern which includes the two or more pads and is connected or filled with a pattern width larger than the minimum width of the pads, wherein outer peripheries of the pads included in the solid pattern are covered with solder resist, all leading wires from the pads not included in the solid pattern are connected to the inner conductive layers of the copper-laminated plates through blind via holes connecting the surface conductive layer and the copper-laminated plate therebelow, and inner via holes connecting conductive layers on the top and rear surfaces of at least one of the copper-laminated plates that is nearest to the surface conductive layer are provided, and a conductive film is formed in the inner via holes.

According to the present invention, it is possible to enhance a corrosion resistance of a printed wiring board without applying coating after mounting of parts and to boost a yield at the same time.

BRIEF DESCRIPTION OF THE DRAWINGS

The above and other objects and characteristics of the present invention will be apparent from the following description of the embodiments with reference to the appended drawings. In which.

DETAILED DESCRIPTION OF THE PREFERRED EMBODIMENTS

Figure 1:
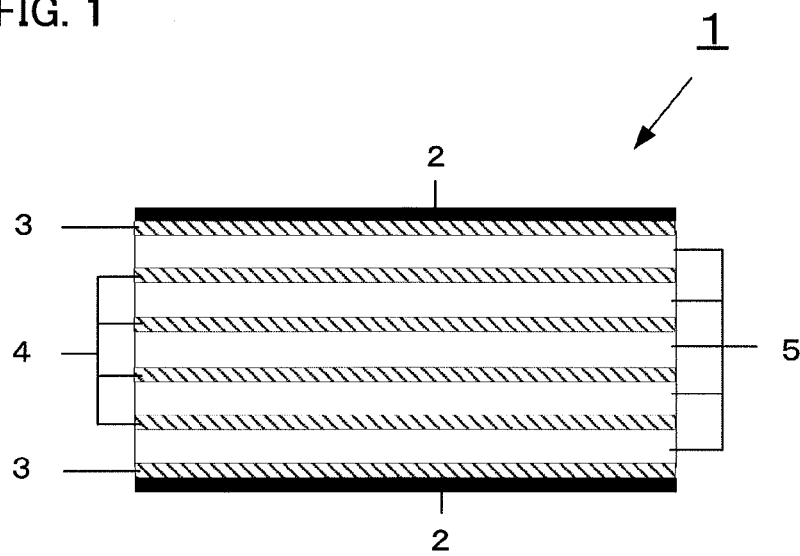
FIG. 1 is a diagram for explaining a cross-section structure of a printed wiring board.

FIG. 1 is a diagram for explaining a cross-section structure of a printed wiring board.

For printed wiring boards used in various fields of electric devices, a multilayered printed wiring board has been paid attention along with a demand for higher density and higher integration. The multilayered printed wiring board 1 is configured such that multiple circuit-formed inner conductive layers 4, multiple insulation resin layers 5 and surface conductive layers 3 are integrally laminated and solder resist layers 2 are provided on the surface conductive layers 3. The surface conductive layers 3 or the inner conductive layers 4 and the insulation resin layers 5 are alternately laminated. The solder resist layer 2 is a comfomal coating for covering the surface of the printed wiring board and protecting a circuit pattern formed on the surface conductive layer 3. In the present invention, the printed wiring board 1 having the multilayered structure is provided with inner via holes (IVH) as conductively-plated buried conductive holes, and conductively-plated blind via holes (BVH).

Figure 2:
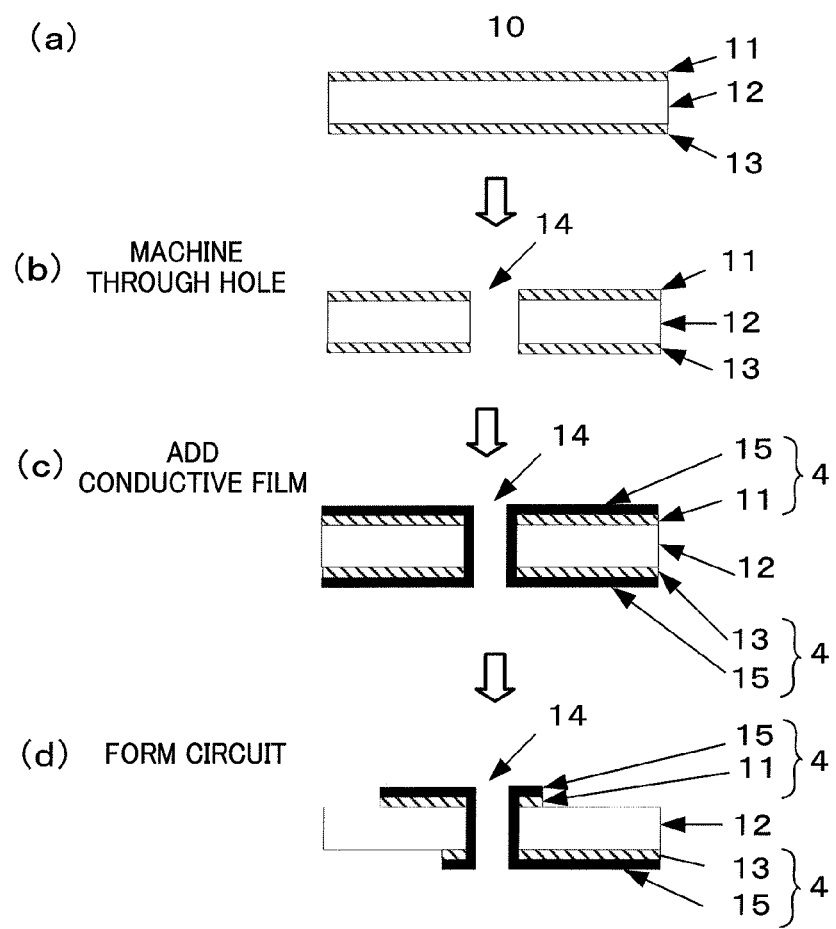
FIG. 2 is a diagram for explaining the steps of manufacturing an inner via hole (IVH)
Figure 3:
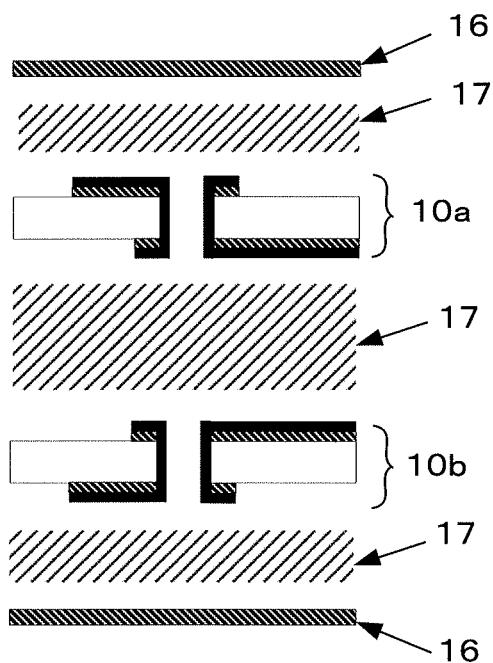
FIG. 3 is a diagram for explaining a structure of a printed wiring board having an inner via hole (IVH)
Figure 3:
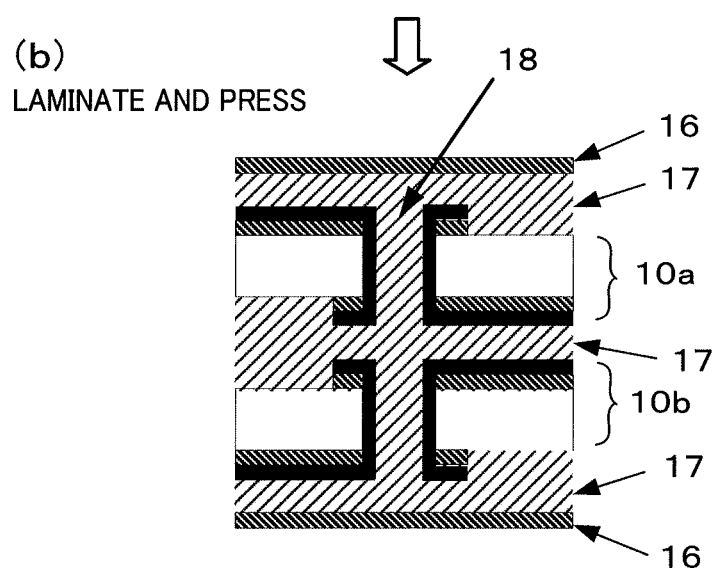

The steps of forming the inner via hole (IVH) in the printed wiring board 1 will be described with reference to FIGS. 2 and 3. FIG. 2 is a diagram for explaining the formation of a through hole and a circuit on a copper-laminated plate. FIG. 3 is a diagram for explaining the printed wiring board having the inner via hole (IVH).

The inner via hole (IVH) is configured such that it is buried in the printed wiring board and does not appear on the outer layer in order to mutually connect the individual inner conductive layers in the printed wiring board.

A copper-laminated plate 10 (FIG. 2A) in which copper foils 11 and 13 are provided on both surfaces of an insulation resin material 12 is provided with a through hole 14 at a position where the inner via hole (IVH) is to be formed by use of a machining method such as drill machining or laser machining (see FIG. 2B). A conductive plating processing for forming a conductive film 15 on the inner wall of the through hole 14 and the copper foils 11, 13 is performed in order to form the through hole 14 provided in the copper-laminated plate 10 as the inner via hole (IVH) which is a conductively-plated buried conductive hole (conductive film addition) (FIG. 2C). The copper foils 11 and 13 on which the conductive film 15, 15 is formed correspond to the inner conductive layers 4 in FIG. 1. A desired circuit pattern is formed in the inner conductive layers 4, 4 (FIG. 2D).

A plurality of (two in FIG. 3) copper-laminated plates 10 described in FIG. 2 are used to configure the printed wiring board 1 in which the inner via hole (IVH) is formed. A surface copper foil 16, a prepreg 17, a copper-laminated plate 10a, a prepreg 17, a copper-laminated plate 10b, a prepreg 17 and a surface copper foil 16 are pressed together (laminated and pressed together) to create the printed wiring board 1 having an inner via hole (IVH) 18.

The number of copper-laminated plates 10 to be laminated is not limited to two and may be three or more. The inner via hole (IVH) need not be added to the copper-laminated plates 10 other than one that is nearest to the surface conductive layers. The prepreg 17 is made of a fiber covered with thermosetting resin.

Figure 4:
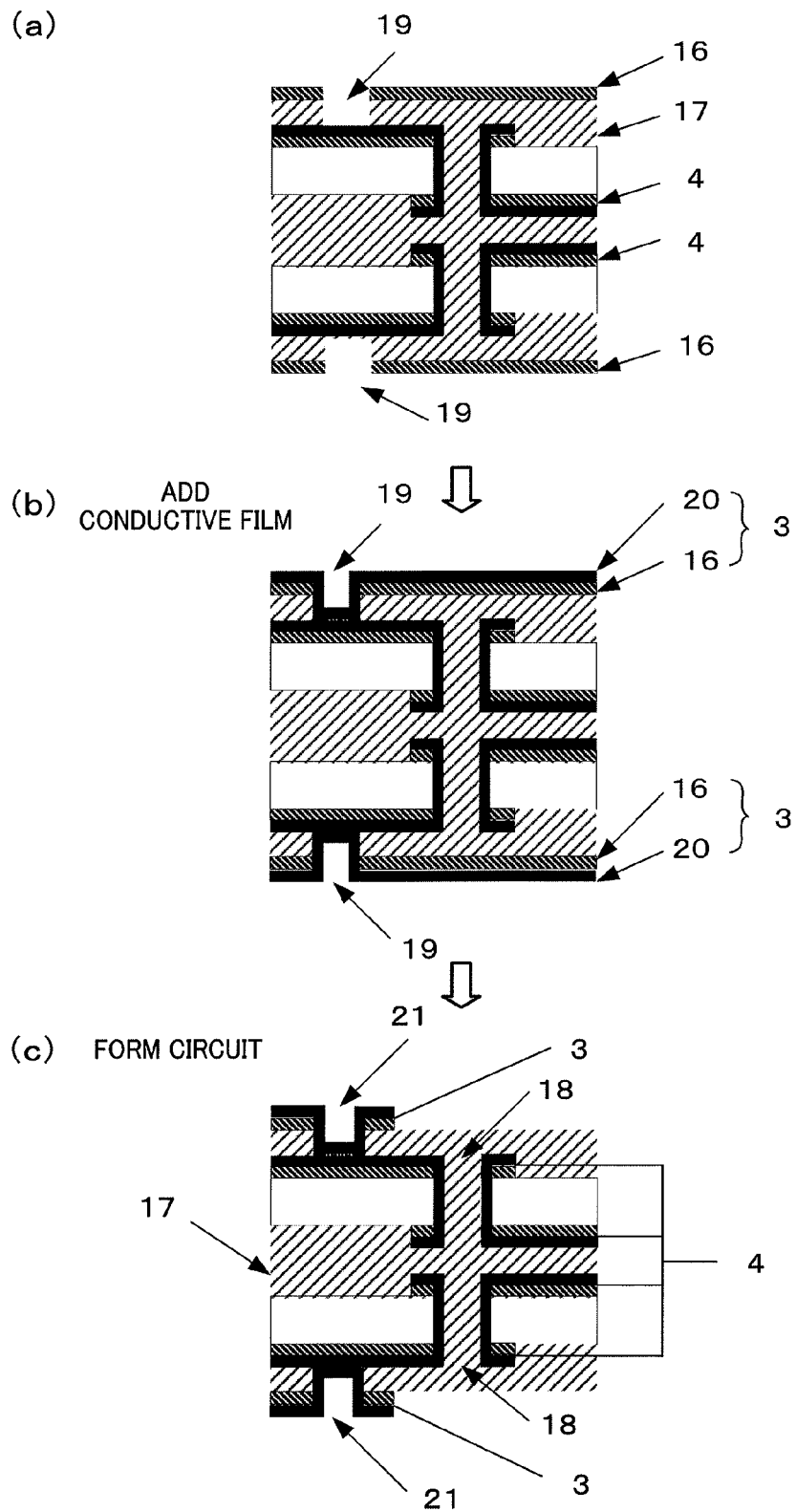
FIG. 4 is a diagram for explaining the steps of manufacturing a blind via hole (BVH) in the printed wiring board.

The printed circuit board 1 according to the present invention has the inner via holes (IVH) and the blind via holes (BVH). FIG. 4 is a diagram for explaining the steps of manufacturing the blind via hole (BVH) in the printed wiring board 1.

After the copper-laminated plates 10 described in FIGS. 2 and 3 are laminated, non-through holes 19, 19 for the blind via holes (BVH) are machined on the surface copper foil 16 and the prepreg 17 by drill machining or laser machining ((a) in FIG. 4). The non-through holes 19, 19 are so deep that the tips reach the inner conductive layers 4 of the copper-laminated plates 10 therebelow. A conductive plating processing (addition of conductive film) for forming conductive films 20, 20 on the inner walls of the non-through holes 19 and the surface copper foils 16, 16 is performed in order to form the non-through holes 19, 19 as the blind via holes (BVH) which are conductively-plated conductive holes ((b) in FIG. 4). The parts where the conductive films 20, 20 are formed in the surface copper foils 16, 16 correspond to the surface conductive layers 3, 3 in FIG. 1. A desired circuit pattern is formed on the surface conductive layers 3, 3 (FIG. 4C).

Figure 5:
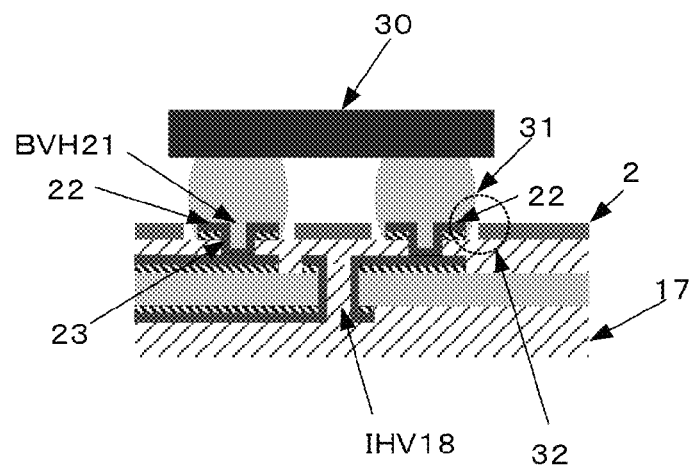
FIG. 5 is a diagram for explaining a printed wiring board according to a first embodiment of the present invention.

FIG. 5 is a diagram for explaining the printed wiring board 1 according to a first embodiment of the present invention.

The pads 22 for mounting a ball grid array part 30 as electronic part on the printed wiring board 1 is formed, as part of the desired circuit pattern of the surface conductive layer 3, in the printed wiring board 1. The ball grid array part 30 is a surface-mount package in which a solder ball terminal 31 for jointing terminals is formed on the bottom of the package in a grid shape. The solder ball terminals 31 of the ball grid array part 30 and the pads 22 provided on the printed wiring board are joined with each other by melting the solder ball terminals 31, and thus the ball grid array part 30 is electrically and mechanically joined to the printed wiring board 1.

In the first embodiment, the pads 22 and the inner conductive layers 4 of the copper-laminated plates 10 therebelow are electrically connected through the blind via holes (BVH) 21. Thereby, the wires 23 leading from the pads 22 need not be provided in the surface conductive layers 3, thereby enhancing a corrosion resistance and a yield of the wiring pattern forming in the surface conductive layers 3.

Further, the inner via holes (IVH) 18 for electrical connection between the inner conductive layers 4 are provided, thereby preventing the wiring patterns from concentrating on the inner conductive layers 4 to which the blind via holes (BVH) 21 are connected. Reference numeral 32 denotes a joint portion between the pad 22 and the solder ball terminal 31. The ball terminal 31 and the pad 22 are soldered at the top and side surfaces of the pad 22, thereby maintaining the strength of soldering high. A part for inserting the lead into the printed wiring board 1 other than the surface-mount parts can lead the wire 23 to any inner conductive layer 4 by a typical board structure.

Figure 6:
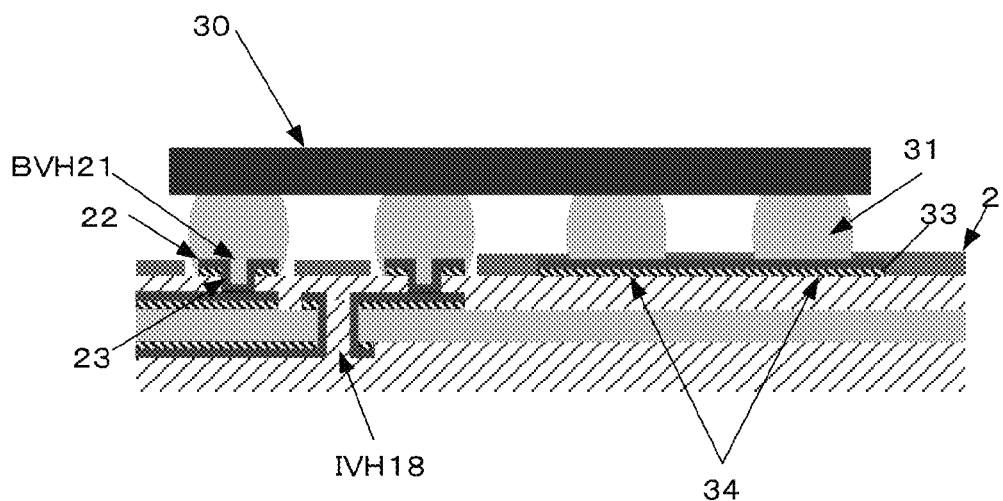
FIG. 6 is a diagram for explaining a printed wiring board according to a second embodiment of the present invention.

FIG. 6 is a diagram for explaining a printed wiring board 1 according to a second embodiment of the present invention.

The printed wiring board 1 is such that the copper-laminated plates 10 and the prepregs 17 are alternately laminated and the surface conductive layers 3 are provided at the outermost positions outside the prepregs 17. The printed wiring board 1 has the individually-formed pads 22 for surface-mount parts to be mounted on the surface of the printed wiring board 1, and at least one solid pattern 33 including two or more pads and formed to be connected or filled with pattern width larger than the minimum width of the pads. The pads 22 and the solid pattern 33 are circuit-formed on the surface conductive layer 3.

The printed wiring board 1 according to the second embodiment is configured such that all the leading wires 23 from the pads 22 not included in the solid pattern 33 are connected to the inner conductive layers 4 of the copper-laminated plates 10 through the blind via holes 2 electrically connecting the surface conductive layers 3 and the inner conductive layers of the copper-laminated plates 10 therebelow, and the printed wiring board 1 has the inner via holes 18 connecting the top and rear surf aces of at least one of the copper-laminated plates 10 that is nearest to the surface conductive layer 3 and the conductive film is formed in the inner via holes 18, thereby electrically connecting the conductive layers on the top and rear surfaces of the copper-laminated plate 10.

Figure 7:
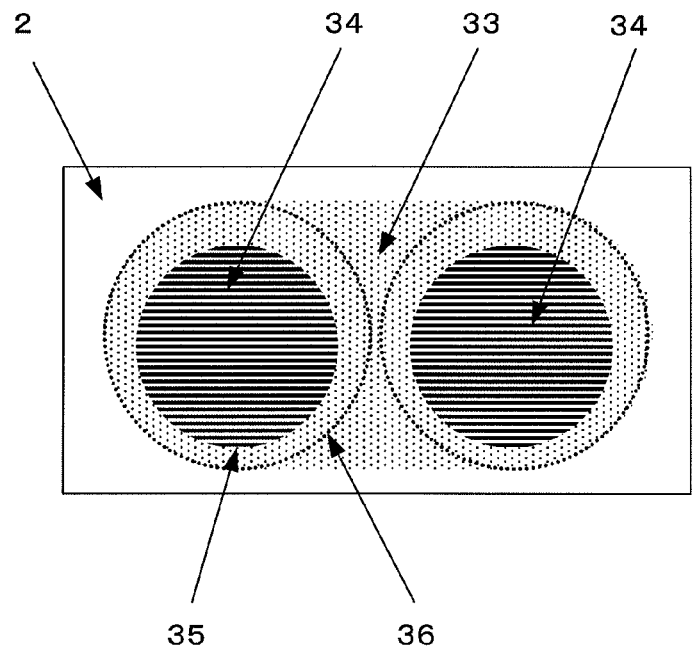
FIG. 7 is a diagram for explaining a solid pattern used for the printed wiring board shown in FIG. 6.
Figure 8A:
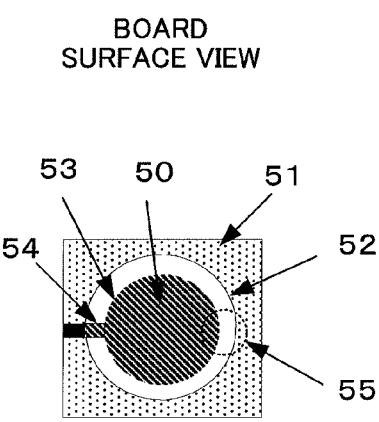
FIGS. 8A and 8B are views for explaining a normal pad.
Figure 8B:
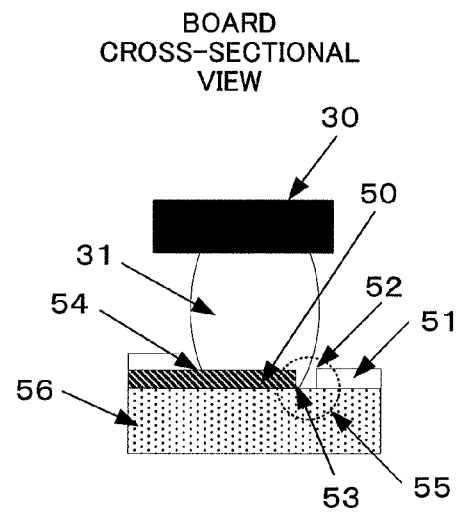
Figure 9A:
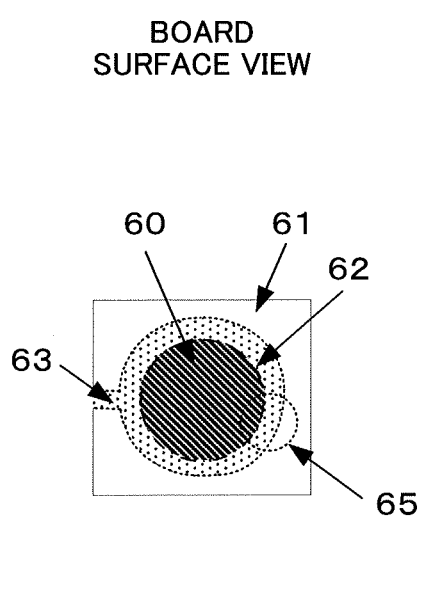
FIGS. 9A and 9B are views for explaining an over-resist pad.
Figure 9B:
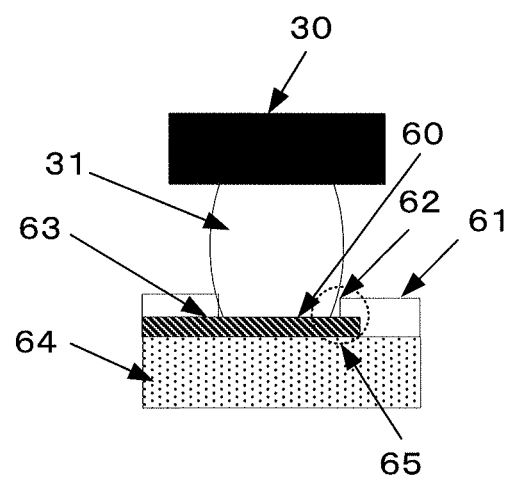

FIG. 7 is a diagram for explaining the solid pattern 33.

The solid pattern 33 is a solid pattern in a minimum structure including two pads. Pads 34, 34 included in the solid pattern 33 are covered at their outer peripheries with the solder resist 2. Reference numeral 35 denotes a position of the opening end of the solder resist 2 and reference numeral 36 denotes an end of the over-resist pad 34. A part terminal not causing a problem of a reduction in the strength of soldering is connected to the pad 34 included in the solid pattern 33, thereby to secure a corrosion resistance in a structure in which the outer periphery of the pad is covered with the solder resist, and thus the leading wires 23 from the pad 34 need not be provided in the inner conductive layers 4 through the blind via holes 21, thereby increasing the degree of freedom of the wiring.

The invention claimed is:

1. A printed wiring board, comprising:
   a plurality of copper-laminated plates and a plurality of prepregs alternately laminated on each other, each of the copper-laminated plates including an insulation layer with copper foils on top and rear surfaces thereof, the copper foils defining a plurality of inner conductive layers of the printed wiring board;
   a surface conductive layer disposed on the outermost prepreg and defining a plurality of pads for surface-mount parts to be mounted on the printed wiring board;
   a plurality of blind via holes electrically connecting the pads to the inner conductive layers, wherein all leading wires from the pads are connected to the inner conductive layers through the blind via holes;
   a plurality of inner via holes connecting the inner conductive layers on the top and rear surfaces of only one copper-laminated plate that is nearest to the surface conductive layer;
   a conductive film formed in the inner via holes; and
   a plurality of solder terminals each covering top and side surfaces of one of the pads.

2. A printed wiring board, comprising:
   a plurality of copper-laminated plates and a plurality of prepregs alternately laminated on each other, each of the copper-laminated plates including an insulation layer with copper foils on top and rear surfaces thereof, the copper foils defining a plurality of inner conductive layers of the printed wiring board;
   a surface conductive layer disposed on the outermost prepreg and defining a plurality of pads for surface-mount parts to be mounted on the printed wiring board;
   at least one solid pattern which includes two or more of the pads and has a width larger than a minimum width of the two or more pads;
   solder resist covering outer peripheries of the two or more pads included in the solid pattern;
   a plurality of blind via holes electrically connecting the pads to the inner conductive layers, wherein all leading wires from the individually-formed pads not included in the solid pattern are connected to the inner conductive layers through the blind via holes;
   a plurality of inner via holes connecting the inner conductive layers on the top and rear surfaces of at least one of the copper-laminated plates that is nearest to the surface conductive layer;
   a conductive film formed in the inner via holes;
   a plurality of first solder terminals each covering top and side surfaces of one of the individually-formed pads not included in the solid pattern; and
   a plurality of second solder terminals each covering a top surface, but not side surfaces, of one of the two or more pads included in the solid pattern;
   wherein a material of the prepregs is in the inner via holes.

3. The printed wiring board of claim 2, wherein the blind via holes do not electrically connect the two or more pads in the solid pattern to the inner conductive layers.

* * * * *